United States Patent  
Cao et al.

(10) Patent No.: US 6,914,849 B2
(45) Date of Patent: Jul. 5, 2005

(54) METHOD AND APPARATUS FOR REDUCING POWER CONSUMPTION IN A MEMORY ARRAY WITH DYNAMIC WORD LINE DRIVER/DECODERS

(75) Inventors: Tai Anh Cao, Austin, TX (US); Sam Gat-Shang Chu, Round Rock, TX (US); Joseph J. McGill IV, Austin, TX (US); Michael Thomas Vaden, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/687,238

(22) Filed: Oct. 16, 2003

(65) Prior Publication Data

US 2005/0083774 A1 Apr. 21, 2005

(51) Int. Cl.$^7$ .............................. G11C 8/00
(52) U.S. Cl. ............ 365/230.06; 365/233; 365/189.11
(58) Field of Search ............... 365/230.06, 230.01, 365/233, 230.05, 230.08, 189.11

(56) References Cited

U.S. PATENT DOCUMENTS

| 5,258,952 | A | | 11/1993 | Coker et al. ............... 365/194 |
|---|---|---|---|---|
| 5,587,950 | A | | 12/1996 | Sawada et al. ............ 365/201 |
| 5,796,669 | A | | 8/1998 | Araki et al. ............... 365/222 |
| 5,835,401 | A | * | 11/1998 | Green et al. ............... 365/149 |
| 5,867,443 | A | | 2/1999 | Linderman ................. 365/228 |
| 6,154,393 | A | * | 11/2000 | Otsuka et al. ......... 365/189.02 |
| 6,188,596 | B1 | | 2/2001 | Holst ......................... 365/63 |
| 6,191,999 | B1 | | 2/2001 | Fujieda et al. ........ 365/230.06 |
| 6,252,818 | B1 | * | 6/2001 | Voss ..................... 365/230.05 |
| 6,256,240 | B1 | | 7/2001 | Shinozaki ................... 365/201 |
| 6,310,817 | B1 | | 10/2001 | Kablanian ............. 365/230.04 |

\* cited by examiner

*Primary Examiner*—Thong Q. Le
(74) *Attorney, Agent, or Firm*—Mark E McBurney; Anthony V S England

(57) ABSTRACT

A memory array includes a storage unit with a number of sections and decoders coupled to respective ones of the sections for decoding an N-bit address signal and responsively asserting a signal on one of the word lines selected by the address signal. Local clock buffers are coupled to respective ones of the decoders for receiving a clock signal and an address signal including M most-significant bits of the N-bit address signal and generating respective timing signals. The decoders receive the timing signal from their respective local clock buffers. Each decoder is operable to alternately precharge and evaluate the N-bit address signal responsive to phases of the timing signal. Each local clock buffer is operable, responsive to a state of the M bits of the address signal, for selecting between holding its timing signal in a deasserted state and enabling its timing signal to follow the clock signal.

13 Claims, 4 Drawing Sheets

METHOD AND APPARATUS FOR REDUCING POWER CONSUMPTION IN A MEMORY ARRAY WITH DYNAMIC WORD LINE DRIVER/DECODERS

BACKGROUND

1. Field of the Invention

The present invention concerns power consumption for computer system memory arrays, and, more particularly, concerns power consumption for such memory arrays with dynamic word line driver circuitry.

2. Related Art

An illustrative computer system memory array 100, as shown in FIG. 1 according to the prior art, has a storage unit 110 that is 64 bits wide and has 128 rows, also known as "lines." Each line in the memory array has a corresponding word line WL0, etc., through WL127, for writing to the line. (Likewise, there are word lines for reading, not shown.) A word line driver/decoder 120 (also referred to herein simply as a "word line driver" or as a "decoder") is coupled to the word lines for selecting which line to access. The decoder selects which word line is accessed responsive to receiving seven address bits and a valid bit.

For a memory array 100 having one write port, all 64 bits of the line are accessed in the write operation when a word line is selected. With a row being so wide this is an electrical load that makes it difficult for the decoder 120 to operate fast enough for a high frequency memory system. The row width is only one of the reasons for this timing problem. Also important is the 128 line column width. It takes time to decode 7 address bits into 128 write word lines. Furthermore, these 7 address bits have to be AND'ed with the valid bit. For example to decode word line 0 (0000000), we have: wr0_addr_<0>AND wr0_addr_b<1>AND . . . wr0_addr_b<6>AND wr0_v where "wr0" means write address/valid of port 0, and "_b" means complement. To implement this an 8 input NAND gate is needed.

It is known to use dynamic circuitry for a memory array word line decoder 120, as shown in FIG. 1, because dynamic circuitry tends to be faster than static circuitry. Dynamic circuitry also tends to require less area, and thus permit higher density designs. Dynamic circuitry, of course, operates in cycles timed by a clock signal, CLK. The dynamic circuitry of decoder 120 operates each cycle in a precharge mode and then an evaluate mode as the clock signal, CLK, is deasserted and then asserted. The clock signal, CLK, is buffered to the decoder 120 by a local clock buffer 130, which also receives a valid signal. The buffer 130 permits its output to the decoder to follow the CLK signal input if the valid signal is asserted. Otherwise, if the valid signal is deasserted the buffer 130 deasserts its output, holding the decoder 120 precharged and on standby.

The constant switching of dynamic circuitry consumes power. With ever-increasing circuit densities, power reduction is an Important issue. Therefore, there is a need to reduce power consumption in memory arrays that use dynamic word line drivers.

SUMMARY OF THE INVENTION

The foregoing need is addressed in the present invention. According to an embodiment of the present invention for a single-port memory array, the memory array has a storage unit that is divided into a number of sections, each having its own dynamic decoder circuitry. Local clock buffers ("LCB's") are associated with each of the respective decoders and a clock signal is fed to the clock buffers. In prior art, as shown in FIG. 1, an LCB is also used, but it is controlled by the valid bit. In contrast, for the present invention LCB's are controlled by the valid bit and the most significant bit or bits of a write address, as described below.

Each of the decoders receives a timing output from its own local clock buffer circuitry, instead of receiving the clock signal more directly. Each LCB selectively holds its output timing signal in a deasserted state to hold its decoder in a power conserving mode or else enables its output timing signal to follow the clock signal CLK, effectively passing the clock signal through so that its decoder can evaluate an address.

In order to do this, the LCB's also receive a number of the most significant bits asserted on address lines that are coupled to the decoders. For example, if there are 128 word lines and eight decoders for the memory array, each LCB is coupled to the first three address lines and is configured to respond to its own unique, three-bit address. That is, the state of the first three address bits determines which one of the LCB's passes the clock signal to its associated decoder. The decoder in turn evaluates to an address asserted on the memory array address and valid lines. For the array with 128 word lines, the decoders are coupled to seven address lines and a valid line and each decoder is configured to respond to its own unique, seven-bit address.

In this manner, all of the decoders can be placed into the power conserving, precharge mode when the memory array is not being accessed. And then, when the memory array is accessed, the address being asserted to select a word line is screened by the LCB's and only the one of the decoders that handles the selected word line is activated to evaluate the address and drive the word line.

Objects, advantages, additional aspects, and other forms of the invention will become apparent upon reading the following detailed description and upon reference to the accompanying drawings.

DETAILED DESCRIPTION OF A PREFERRED EMBODIMENT

The claims at the end of this application set out novel features which applicants believe are characteristic of the invention. The invention, a preferred mode of use, further objectives and advantages, will best be understood by reference to the following detailed description of an illustrative embodiment read in conjunction with the accompanying drawings.

Figure 1:
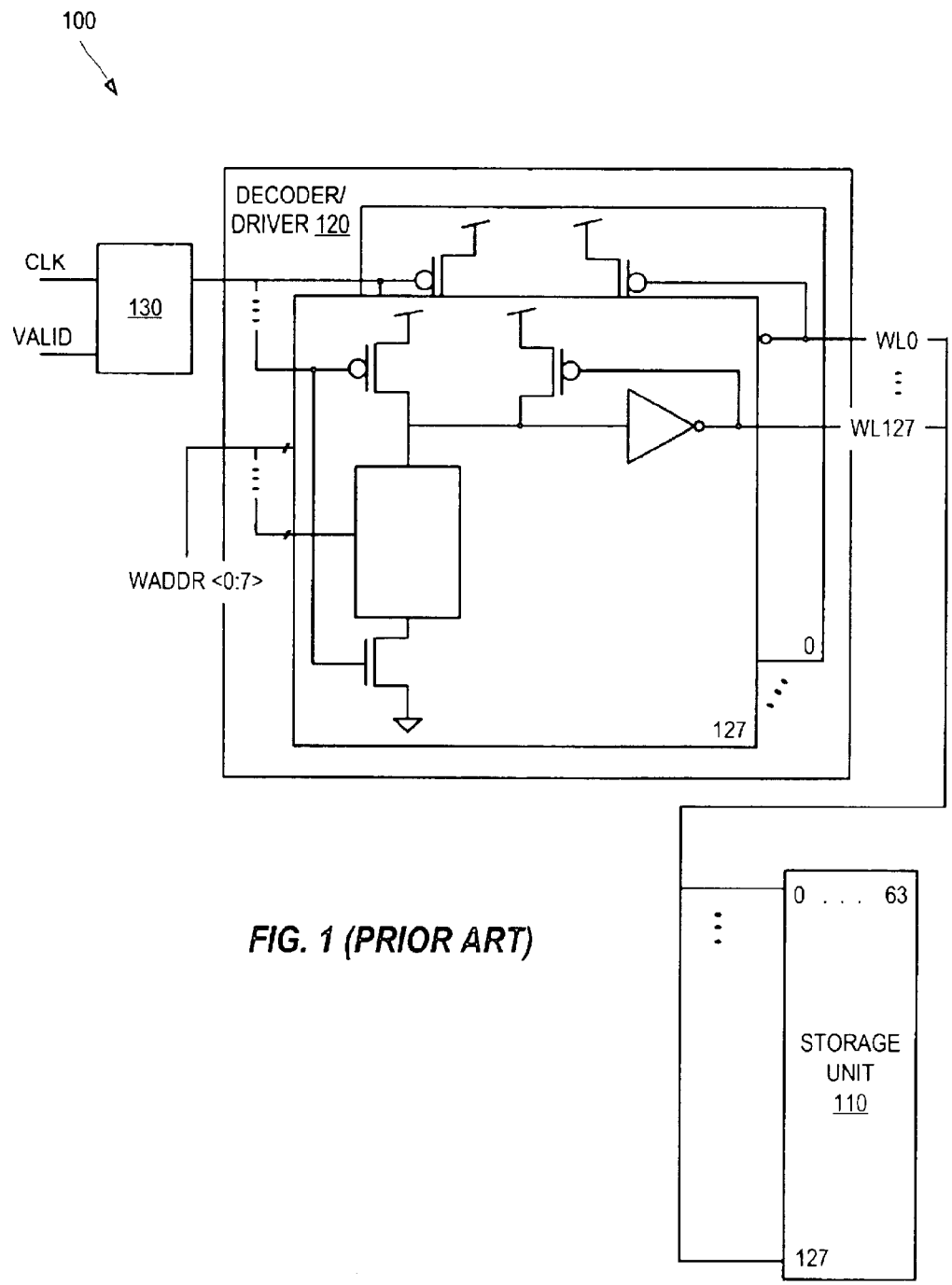
FIG. 1 illustrates a prior art memory array.

It is a common power reduction technique to "turn off" the clock when dynamic circuitry is not needed. That is to say, when the dynamic circuitry does not need to operate, the clock signal to the circuitry is deasserted and the circuitry waits in its precharge mode. While the clock signal CLK to the entire word line driver/decoder 120 of FIG. 1 could be deasserted in order to put the decoder 120 into a power conserving mode, the present invention involves a recognition that a more efficient arrangement is possible.

Figure 2:
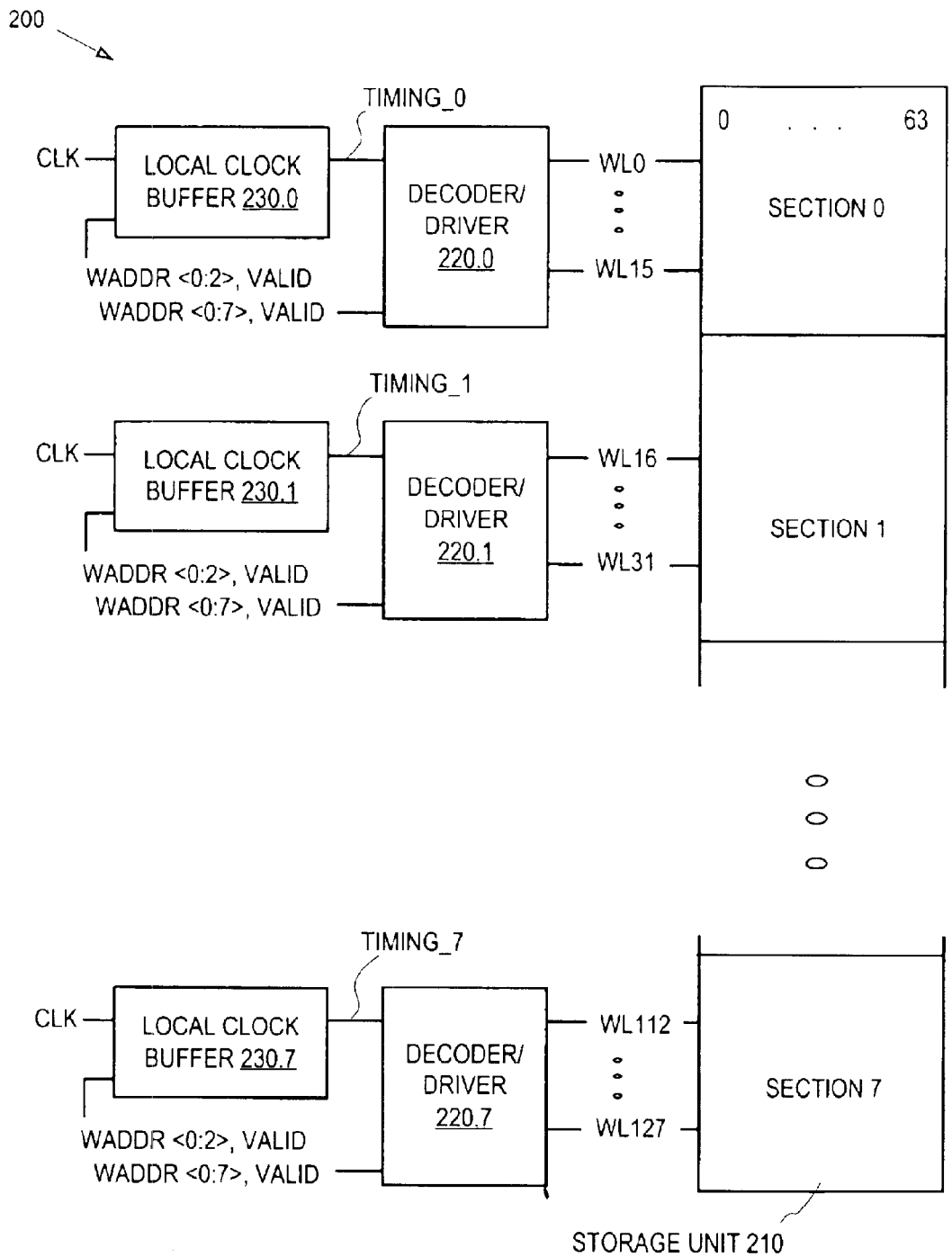
FIG. 2 illustrates a memory array, according to an embodiment of the present invention.

Referring now to FIG. 2, according to an embodiment of the present invention for a single-port memory array 200, a storage unit 210 is divided into eight sections, section 0, section 1, etc., through section 7, as shown, each having its own dynamic-circuitry-implemented decoder 220.0, 220.1, etc. through 220.7. The clock signal CLK is fed to eight LCB's 230.0, 230.1, etc. through 230.7 for each one of the corresponding decoders. Each of the decoders 220.0, 220.1, etc. receives a timing signal TIMING0, TIMING1, etc. through TIMING 7, output from its own respective LCB circuitry 230.0, 230.1, etc. instead of receiving the clock signal CLK more directly. In this manner, LCB's 230.0, 230.1, etc. can place all of the decoders 220.0, 220.1, etc. into the power conserving, precharge mode when the storage unit 210 is not being accessed by holding their respective timing signals TIMING0, TIMING1, etc. in the deasserted state.

The LCB's 230.0, 230.1, etc. are also coupled to the first three lines of the address lines that are coupled to the decoders 220.0, 220.1, etc. The LCB's 230.0, 230.1, etc. respond to the three address bits. In this manner, when the storage unit 210 is accessed, and an address is asserted to select one of the word lines WL0, WL1, etc. through WL127, the address is screened by the LCB's 230.0, 230.1, etc. and only the one of the decoders 220.0, 220.1, etc. that handles the selected word line is activated to evaluate the address and drive the word line. That is, each LCB 230.0, 230.1, etc. is configured to respond to its own unique, three-bit address, so that the state of the first three address bits determines which one of the LCB's asserts its timing signal responsive to the clock signal CLK, effectively passing the clock signal CLK on to its decoder 220.0, 220.1, etc. Each decoder is configured to respond to its own unique, seven-bit address. Responsive to its timing signal being asserted, a decoder evaluates the address being asserted on its seven address lines and selects a word line according to the asserted address.

According to this arrangement, the LCB's can be static circuits, which consume less power, and still be fast enough since they don't have much load. That is, the only load on the LCB's is just the recharge/evaluate control transistors of their respective decoders.

Below is a table showing logic functionality of the LCB's 230.0 through 230.7 and decoders 220.0 through 220.7 with respect to address signals WADDR<0:7>:

| WADDR bits: | | | | | | | |
|---|---|---|---|---|---|---|---|
| 0 | 1 | 2 | | 3 | 4 | 5 | 6 | 7 |
| 0 | 0 | 0 | selects LCB 230.0 and decoder 220.0 | selects one of WL 0 through 15 | | | | |
| 0 | 0 | 1 | selects LCB 230.1 and decoder 220.1 | selects one of WL 16 through 31 | | | | |
| 0 | 1 | 0 | selects LCB 230.2 and decoder 220.2 | selects one of WL 32 through 31 | | | | |
| 0 | 1 | 1 | selects LCB 230.3 and decoder 220.3 | selects one of WL 48 through 47 | | | | |
| 1 | 0 | 0 | selects LCB 230.4 and decoder 220.4 | selects one of WL 64 through 63 | | | | |
| 1 | 0 | 1 | selects LCB 230.5 and decoder 220.5 | selects one of WL 80 through 79 | | | | |
| 1 | 1 | 0 | selects LCB 230.6 and decoder 220.6 | selects one of WL 96 through 111 | | | | |
| 1 | 1 | 1 | selects LCB 230.7 and decoder 220.7 | selects one of WL 112 through 127 | | | | |

Figure 3:
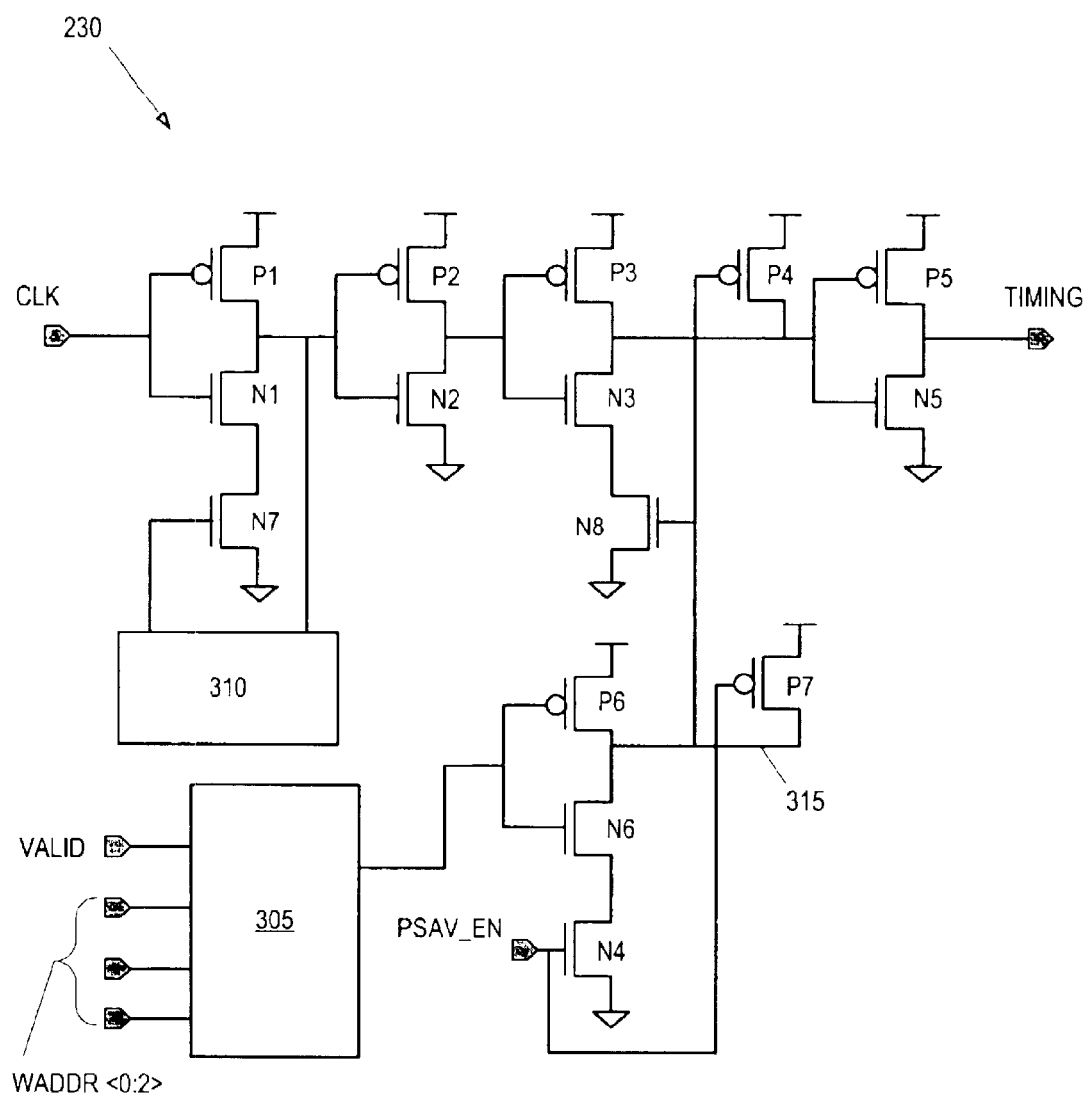
FIG. 3 illustrates a typical one of the local clock buffers shown in FIG. 2, according to an embodiment of the present invention.

Referring now to FIG. 3, a local clock buffer 230 is shown, according to an embodiment of the present invention. Local clock buffer 230 is typical for the LCB's 230.0, 230.1, etc. shown in FIG. 2. The local clock buffer 230 has four inverters formed by transistor pairs P1/N1, P2/N2, P3/N3 and P5/N5. The four inverters are coupled in series, with the first of the inverters, P1/N1, receiving the clock signal, CLK, and the last in the series, P4/N4, outputting the TIMING signal.

LCB 230 includes control circuitry 310 coupled between the first and second inverters and coupled to the first inverter P1/N1 by means of a transistor N7 in series with one of the conducting electrodes of N1. However, this control circuitry 310 provides functionality such as testing that is not relevant to the present invention. For the sake of the present invention it should be assumed that control circuitry 310 turns on transistor N7, thereby coupling the conducting electrode of transistor N1 to ground.

LCB 230 also includes a local clock buffer decoder 305 which receives the valid bit and the three most significant bits WADDR<0:2> of the address signal WADDR<0:7> shown in FIG. 2. The decode logic function of this typical decoder 305 varies depending upon the LCB to which the decoder 305 applies, as shown in the above table. That is, if the decoder 305 (shown in FIG. 3 in typical fashion) is for the specific LCB 220.2 of FIG. 2, for example, then the decoder 305 logic is configured such that decoder 305 asserts its output only if WADDR<0:2>="0 1 0."

The output of decoder 305 is coupled to an inverter formed by transistor pair P6/N6, which in turn feeds its output to control node 315. The ground-connected electrode of transistor N6 of the inverter is coupled to ground by means of a control transistor N4, the gate of which receives a power save enable signal, PSAV_EN. A pull-up transistor P7 is also coupled, by means of its conducting electrodes, between the control node 315 and a voltage supply. The transistor gate receives the power save enable signal, so that if the signal is deasserted transistor P7 turns on and pulls up the control node 315. Coupled, by means of its conducting electrodes, between the voltage supply and the output of the third inverter, P3/N3, is another pull-up transistor P4. This pull-up transistor P4 has its gate coupled to control node 315 so that if the control node is pulled up transistor P4 is turned off, and if the control node 315 is pulled down transistor P4 is turned on. Finally, control node 315 is also coupled to the gate of a transistor N8, which has its conducting electrodes interposed between transistor N3's conducting electrode and ground, so that if the control node 315 is pulled down this isolates the output of inverter P3/N3 from ground, permitting transistor P4 to pull up this output, which in turn drives the output of the fourth inverter P5/N5 low.

According to this arrangement, with the power save enable signal PSAV_EN low this turns off transistor N4 and turns on transistor P7, pulling control node 315 high, which turns off transistor P4 and turns on transistor N8 so TIMING can follow CLK irrespective of WADDR. With the power save enable signal PSAV_EN high this turns off P7 and turns on N4, enabling WADDR to control node 315. In this circumstance if the address bits WADDR<0:2>select decoder 305 then the decoder deasserts its output, which in turn drives control node 315 high. This turns off transistor P4 and turns on transistor N8, so that TIMING will follow CLK. Conversely, if the address bits WADDR<0:2>do not select decoder 305 then the decoder asserts its output, which in turn pulls control node 315 low. This turns on transistor P4 and turns off transistor N8, so that TIMING is deasserted irrespective of CLK.

It should be especially appreciated from the details shown in FIG. 3 and described above that while LCB's 230.1, etc.

receive a clock signal as do dynamic circuits, and while the output of such an LCB 230.1 feeds a dynamic decoder, nevertheless the local clock buffer 230.1 are all static circuits that select between generating outputs that follow their input signals or else deasserting their outputs, depending on the selected mode of operation as determined by the received address bits WADDR<0:2>. That is, while the address signal may change periodically, such an LCB 230.1 does not operate in clocked cycles of precharging during one clock phase and then evaluating the address signal during another clock phase, as does a dynamic circuit. Instead, the LCB 230.1 evaluates the address and valid-bit signals continuously and continuously generates an output that either follows the input signal (CLK) or else is deasserted responsive to the address and valid-bit signals. Thus, the evaluation by such an LCB 230.1 of the address bit signal WADDR<0:2> is not interrupted by a precharging state of the LCB 230.1 as would be the case if the LCB 230.1 were instead a dynamic circuit.

Referring again to FIG. 2, to reiterate, from the above it should be appreciated that if an LCB 220.0, 220.1, etc. is not addressed by the three address bits WADDR<0:2>asserted on its address line then the LCB holds its output timing signal in a deasserted state, which in turn holds its decoder 230.0, 230.1, etc. in a power conserving mode. If, on the other hand, the LCB is selected by the address bits, then the LCB's output timing signal follows the CLK signal, in which case the timing signal enables the LCB's decoder to evaluate an address. In this manner, all eight of the decoders can be placed into the power conserving, precharge mode when the memory array is not being accessed. And then, when the memory array is accessed the address being asserted to select a word line is screened by the LCB's and only the one of the decoders that handles the word line is activated.

The description of the present embodiment has been presented for purposes of illustration, but is not intended to be exhaustive or to limit the invention to the form disclosed. Many modifications and variations will be apparent to those of ordinary skill in the art.

Figure 4:
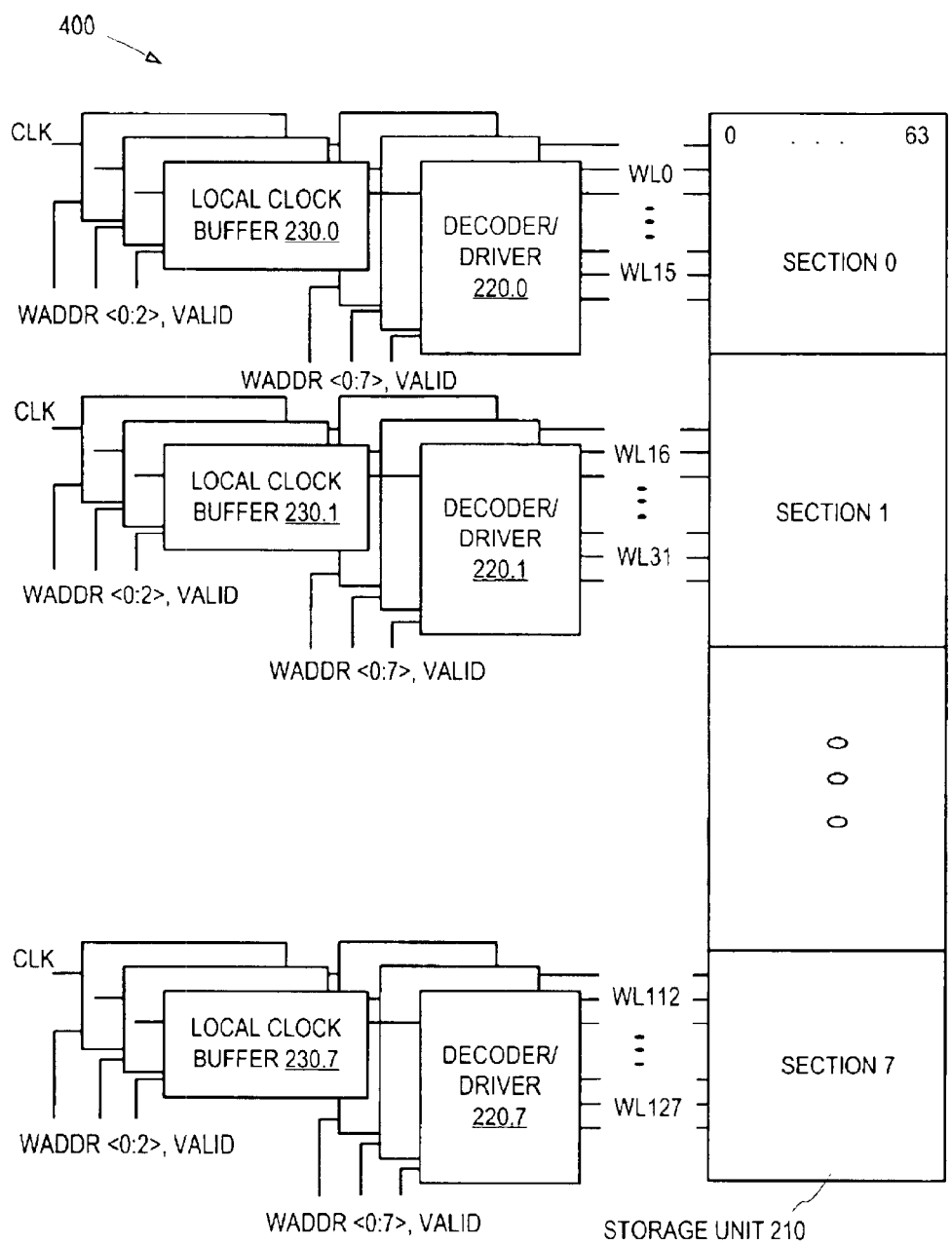
FIG. 4 illustrates a variation of the memory array of FIG. 2, according to an embodiment of the invention.

A variation of memory array 200 of FIG. 2 is shown in FIG. 4, for example. The storage unit 210 in the memory array 400 of FIG. 4 is divided into eight sections, section 0, section 1, etc., through section 7, as shown, each having its own dynamic-circuitry-implemented decoder 220.0, 220.1, etc., through 220.7 and associated local clock buffers 230.0, 230.1, etc., through 230.7, as in the memory array 200 of FIG. 2. However, according to the embodiment of the invention in FIG. 4 the memory array 400 has three write ports for write accesses to the storage unit 210, as indicated by the presence of three sets of word lines, decoders and LCB's for each storage unit 210 section. Other embodiments have different numbers of ports.

The disclosure herein has focused on methods and structures for write accesses to a storage unit by means of dynamic decoders, static local clock buffers and write word lines. In another variation that should be apparent to those of ordinary skill in the art based on the above, similar methods and structures are applied with some modification for read accesses to a storage unit by means of dynamic decoders, static local clock buffers and read word lines.

The embodiments were chosen and described in order to best explain the principles of the invention, the practical application, and to enable others of ordinary skill in the art to understand the invention. Various other embodiments having various modifications may be suited to a particular use contemplated, but may be within the scope of the present invention. Moreover, it should be understood that the actions in the following claims do not necessarily have to be performed in the particular sequence in which they are set out.

What is claimed is:

1. A method for a memory array, wherein the memory array has a storage unit with a number of sections and a number of decoders coupled by word lines to respective ones of the sections, and wherein each decoder is coupled to an associated local clock buffer, the method comprising the steps of:
   a) receiving, by the local clock buffers, a clock signal and an address signal including M most-significant bits of the N-bit address signal; and
   b) generating respective timing signals by the local clock buffers, wherein generating the timing signal by such a local clock buffer includes the steps of:
      evaluating a state of the M bits of the address signal; and
      selecting between holding such a timing signal in a deasserted state and enabling the timing signal to follow the clock signal responsive to the state of the M bits of the address signal;
   c) receiving the timing signals from the local clock buffers by the respective decoders;
   d) holding a precharging state by a number of the decoders responsive to the decoders's local clock buffers holding their respective timing signals in a deasserted state; and
   e) evaluating the N-bit address signal and responsively asserting a signal on a selected one of the word lines by one of the decoders responsive to the decoder's local clock buffer timing signal following the clock signal.

2. The method of claim 1, wherein the evaluating of the state of the M bits of the address signal by the local clock buffers is continuous rather than being interrupted by a precharging state responsive to a clock signal.

3. The method of claim 1, comprising the step of the local clock buffers receiving a valid-bit signal.

4. The method of claim 1, the storage unit having multiple ports, wherein each of the word lines is coupled to a number of decoders.

5. The method of claim 1, comprising the step of accessing a line of memory in the storage unit associated with the selected word line, wherein the accessing is a read access.

6. The method of claim 1, comprising the step of accessing a line of memory in the storage unit associated with the selected word line, wherein the accessing is a write access.

7. A memory array comprising:
   a storage unit having a number of sections, each section having a number of word lines for accessing a line of memory in the storage unit;
   storage unit decoders coupled to respective ones of the sections, such a storage unit decoder being operable to decode an N-bit address signal and responsively assert a signal on one of the word lines selected by the address signal; and
   local clock buffers coupled to respective ones of the storage unit decoders, wherein such a local clock buffer includes:
      a number L of series-connected inverters, with the first of the L inverters operable for receiving a clock signal and the last of the L inverters operable to responsively output a timing signal;
      a local clock buffer decoder for receiving a valid-bit signal and M most-significant bits of the N-bit address signal, wherein a decode logic function of the respective decoders varies depending upon the local clock buffer;

a control node, wherein an output of the local clock buffer decoder is coupled to the control node;

a pull-up transistor coupled, by conducting electrodes, between a voltage supply and an output of one of the L inverters, the pull-up transistor having a gate coupled to the control node so that if the control node is high the pull-up transistor tends to be tuned off, and if the control node is low the pull-up transistor tends to be turned on; and a isolation transistor having a gate coupled to the control node and having conducting electrodes interposed between ground and a transistor of a penultimate one of the L inverters, so that if the control node is low this tends to isolate an output of the penultimate inverter from ground, permitting the pull-up transistor to pull up an output of the penultimate inverter, which in turn tends to drive the timing signal low, and if the control node is high this permits the timing signal to follow the clock signal;

wherein each of the storage unit decoders receives the liming signal from its respective local clock buffer and each storage unit decoder is operable to precharge responsive to a first phase of the timing signal and to evaluate the N-bit address signal responsive to a second phase of the timing signal.

8. The memory array of claim 7, wherein the local clock buffer decoder is coupled to the control node via an intermediate inverter.

9. The memory array of claim 8, wherein an electrode of a transistor of the intermediate inverter is coupled to ground by means of a control transistor, the gate of the control transistor being operable to receive a power save enable signal, and the local clock buffer includes:

a second pull-up transistor coupled, by conducting electrodes, between the control node and the voltage supply and having a gate for receiving the power save enable signal, so that if the power save enable signal is deasserted the second pull-up transistor tends to turn on and pull up the control node.

10. The memory array of claim 9, wherein an electrode of a transistor of the first one of the L inverters is coupled to ground by means of a second control transistor, and the local clock buffer includes:

control circuitry coupled between the first and second ones of the L inverters and coupled to a gate of the second control transistor.

11. The memory array of claim 7, the storage unit having multiple ports, wherein each of the word lines is coupled to a number of storage unit decoders.

12. The memory array of claim 7, wherein the word lines are for read accesses to the storage unit.

13. The memory array of claim 7, wherein the word lines are for write accesses to the storage unit.

* * * * *